(12) United States Patent
Yamauchi

(10) Patent No.: US 7,338,188 B2
(45) Date of Patent: Mar. 4, 2008

(54) LIGHT EMITTING DEVICE, METHOD OF MANUFACTURING LIGHT EMITTING DEVICE, AND IMAGE DISPLAY DEVICE

(75) Inventor: Taisuke Yamauchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 199 days.

(21) Appl. No.: 11/359,530

(22) Filed: Feb. 23, 2006

(65) Prior Publication Data

US 2006/0221633 A1    Oct. 5, 2006

(30) Foreign Application Priority Data

Mar. 29, 2005  (JP) .............................. 2005-094807
Oct. 11, 2005  (JP) .............................. 2005-295964

(51) Int. Cl.
F21V 5/00    (2006.01)
H01S 3/00    (2006.01)
G02B 26/00   (2006.01)

(52) U.S. Cl. ...................... 362/318; 362/331; 359/228; 372/50.11

(58) Field of Classification Search ................ 362/331, 362/318, 800; 372/50.11, 96, 50.124; 359/227–228; 257/98
See application file for complete search history.

(56) References Cited

U.S. PATENT DOCUMENTS

| 5,493,577 A | 2/1996 | Choquette et al. |
| 5,784,400 A * | 7/1998 | Joannopoulos et al. ....... 372/96 |
| 5,955,749 A | 9/1999 | Joannopoulos et al. |
| 6,462,356 B1 * | 10/2002 | Koyama et al. ............... 257/79 |
| 6,704,335 B1 | 3/2004 | Koyama et al. |
| 6,727,646 B1 * | 4/2004 | Koyama et al. ............ 313/506 |
| 6,900,457 B2 | 5/2005 | Toguchi et al. |
| 7,167,606 B2 * | 1/2007 | Gunn et al. ..................... 385/2 |
| 7,194,174 B2 * | 3/2007 | Dridi et al. .................. 385/129 |

FOREIGN PATENT DOCUMENTS

| JP | A-2004-228122 | 8/2002 |
| JP | 2004-128445 A | 4/2004 |
| JP | A-2004-341558 | 12/2004 |
| KR | 2003-0029467 | 4/2003 |

\* cited by examiner

*Primary Examiner*—Ali Alavi
(74) *Attorney, Agent, or Firm*—Oliff & Berridge PLC

(57) ABSTRACT

A light emitting device includes a light emitting portion provided on a reference plane to supply light, and an optical portion provided on the output side of the light emitting portion to transmit light from the light emitting portion. In the device, the optical portion is formed so that its refractive index periodically changes in a two-dimensional direction approximately parallel to the reference plane, and the optical portion can be formed separately from the light emitting portion.

14 Claims, 13 Drawing Sheets

STEP f

STEP g

STEP h

STEP i

STEP j

STEP k

LIGHT EMITTING DEVICE, METHOD OF MANUFACTURING LIGHT EMITTING DEVICE, AND IMAGE DISPLAY DEVICE

The present application claims priority to Japanese Patent Application No. 2005-094807 filed on Mar. 29, 2005, in Japan and Japanese Patent Application No. 2005-295964 filed on Oct. 11, 2005 in Japan, which are hereby expressly incorporated by reference herein in their entirety.

BACKGROUND

The present invention relates to a light emitting device, a method of manufacturing a light emitting device, and an image display device, particularly a solid state light emitting device such as a light emitting diode (hereinafter also referred to as "LED").

There is a known light emitting device having a layered structure including a substrate and a semiconductor layer placed thereon. Light from a light emitting portion is transmitted through the substrate and emitted outside the light emitting device. The light emitting device produced simply by placing a substrate on a light emitting portion sometimes confines light as the light is totally reflected by the interfaces between the substrate and the air, between the light emitting portion and the substrate, and between other layers having different refractive indexes. It has also been known that such a light emitting device produced simply by placing a substrate on a light emitting portion supplies emitted light having a radiation distribution characteristic with a horizontally flat shape. For example, if it is requested that light be efficiently supplied toward an object for illumination as in the light source portion of an image display device, the light emitting device cannot efficiently supply light in a prescribed illumination direction. In order to improve the efficiency of how much emitted light is extracted to the outside (hereinafter as the "outcoupling efficiency") in the light emitting device, and efficiently supply light in a prescribed illumination direction, the light emitting device is for example covered by a semispherical lens. A semispherical lens having a larger size than the light emitting device is employed, so that the total reflection can be reduced at the interface between the light emitting device and the air, while a virtual image having a larger area than that of the light emitting device forms. When for example a light emitting device and lenses are combined to supply light, as the area of the virtual image of the light emitting device increases, light that can be taken by the lenses decreases in some cases. JP-A-2004-128445 discloses a technique of improving the outcoupling efficiency and efficiently supplying light in a prescribed illumination direction without increasing the area of the virtual image.

JP-A-2004-128445 discloses a technique of providing an optical device having a wavelength of a very small order on the surface of a light emitting device. Such a very small optical device can be formed by reforming with laser light. However, a very small region must be irradiated with laser light, which makes it difficult to manufacture the device and pushes up the cost or the yield can be reduced because of necessary processing to the light emitting devices.

SUMMARY

An advantage of some aspects of the present invention is brought about by a light emitting device that can efficiently supply light in a prescribed illumination direction with high outcoupling efficiency, and can be produced more easily and inexpensively, a method of manufacturing such a light emitting device, and an image display device that uses such a light emitting device.

According to an aspect of the invention, a light emitting device includes a light emitting portion provided on a reference plane to supply light, and an optical portion provided on the output side of the light emitting portion to transmit light from the light emitting portion. The optical portion can be formed so that its refractive index periodically changes in a two-dimensional direction approximately parallel to the reference plane, and the optical portion can be formed separately from the light emitting portion.

The optical portion having a refractive index periodically changed in the two-dimensional direction is provided, so that light from the light emitting portion can be prevented from absorbed into the light emitting portion, and light can be supplied with high outcoupling efficiency. The optical portion has approximately the same size as the light emitting portion, so that the outcoupling efficiency can be improved without increasing the area of the virtual image. The optical portion can change light at a large angle with respect to the optical axis to advance at a smaller angle with respect to the optical axis depending on its structure. The optical portion is formed separately from the light emitting portion, so that the yield can be improved as compared with the case of forming the optical portion by carrying out direct working on the light emitting portion. The limitations in forming the optical portion can be reduced as compared with the case of forming the optical device by carrying out working on each of the light emitting devices, and therefore the optical portion, working on which would hitherto be considered difficult, can be manufactured in volume by a simple method and inexpensively. The optical portion can be applied to the light emitting device, working on which would hitherto be considered difficult. In this way, a light emitting device that can efficiently supply light in a prescribed illumination direction with high outcoupling efficiency can be provided, and the device can be produced more easily and inexpensively.

It is preferable that the optical portion includes a plurality of raised portions having a height in a direction approximately orthogonal to the reference plane or a plurality of recessed portions having a depth in a direction approximately orthogonal to the reference plane. As the plurality of raised or recessed portions are provided, the optical portion has mediums having different refractive indexes, i.e., the material forming the optical portion and the air. In this way, the optical portion has its refractive index changed in the two-dimensional direction approximately parallel to the reference plane.

It is preferable that the optical portion is formed in a film state. The optical portion in the film state can be formed separately from the light emitting portion and then layered on the light emitting portion. The film can readily be formed by subjecting a material for the film to press-working. The film material can easily be cut. In this way, the film material formed only by a single transfer operation can be cut into pieces so that a large number of optical portions can readily be manufactured. In addition, using a thermoplastic, heat curing, or photo curing film material, the film material can readily be cured after the press working. The light emitting device can be manufactured easily and inexpensively. The film type optical portion can be applied not only to the light emitting device having an approximately flat output surface but also to a light emitting device having a curved surface, working on which would hitherto be considered difficult. In this way, the use of the film type optical portion significantly improves the usefulness and versatility for applying the optical portion to the light emitting device.

It is preferable that the optical portion has a silicon resin material. The silicon resin material after the pressing is thermally cured, so that the optical portion can easily be formed. The optical portion made of a silicon resin material may have high environmental resistance to heat, light, humidity, and the like. In this way, the light emitting device can readily be formed and is allowed to have high environmental resistance.

It is preferable that the device further includes a buffer layer including a fluid material, and the buffer layer is provided between the light emitting portion and the optical portion. The buffer layer provided between the light emitting portion and the optical portion buffers changes in size between the light emitting portion and the optical portion. The buffer layer provided between the light emitting portion and the optical portion reduces distortions between them, and makes the structure less susceptible to damages. In particular, degradation can be reduced in terms of the structure of the light emitting device that operates at high output level. In this way, the light emitting device that is less susceptible to damages and has a long useful life can be provided.

It is preferable that the optical portion includes the raised portions in an approximately cylindrical shape. Because of the plurality of raised portions, the optical portion has mediums having different refractive indexes from one another in the two-dimensional direction, the silicon resin material and the air. In this way, the optical portion has its refractive index changed in the two-dimensional direction approximately parallel to the reference plane.

It is preferable that the raised portions are in such a positional arrangement that one raised portion and two other raised portions adjacent to the raised portion form a triangle on a plane approximately parallel to the reference plane. As the raised portions are arranged to form a triangle in the optical portion, the raised portions may be provided in a densely packed state. In this way, light advancing approximately parallel to the optical axis is allowed to increase and a good radiation characteristic can be obtained.

It is preferable that the ratio produced by dividing the height of the cylindrical shape of the raised portion by the diameter of the cylindrical shape is in the range from 2 to 3. In this way, an increased amount of light is allowed to advance in a direction approximately parallel to the optical axis, so that a good radiation characteristic can be obtained.

It is preferable that the ratio produced by dividing the height of the cylindrical shape of the raised portion by the diameter of the cylindrical shape is about 2.5. In this way, a further increased amount of light is allowed to advance in a direction approximately parallel to the optical axis, so that a better radiation characteristic can be obtained.

It is preferable that the ratio produced by dividing the diameter of the cylindrical shape of the raised portion by the pitch at which the plurality of raised portions are aligned is in the range from 0.65 to 0.85. In this way, an increased amount of light is allowed to advance in a direction approximately parallel to the optical axis, so that a good radiation characteristic can be obtained.

It is preferable that the optical portion is arranged so that the pitch at which the plurality of raised portions are aligned is in the range from 500 nanometers to 2000 nanometers. In this way, an increased amount of light is allowed to advance in a direction approximately parallel to the optical axis, and a good radiation characteristic can be obtained.

According to yet another aspect of the invention, a method of manufacturing a light emitting device supplying light from a light emitting portion can be provided and the method includes forming an optical portion having a refractive index periodically changed in a two-dimensional direction, and layering the optical portion on the light emitting portion provided on a reference plane approximately parallel to the two-dimensional direction. The use of the optical portion having its refractive index periodically changed in a two-dimensional direction approximately parallel to the reference plane allows light to be supplied with high outcoupling efficiency in a prescribed illumination direction. In the process of forming the optical portion, the optical portion is formed separately from the light emitting portion, so that the yield can be improved as compared with the case of forming the optical portion by carrying out working to each light emitting device. Since limitations in forming the optical portion are reduced as compared with the case of forming the optical portion by carrying out working to each light emitting device, the optical portion, working on which would hitherto be considered difficult, can be manufactured in volume by a simple method and inexpensively. In this way, a light emitting device capable of efficiently supplying light with high outcoupling efficiency in a prescribed illumination direction can be manufactured easily and inexpensively.

According to a still further aspect of the invention, an image display device is provided and the device includes a light source portion including a light emitting device that supplies light, and a spatial light modulator that modulates light from the light source portion in response to an image signal. The light emitting device is a light emitting device according to any one of the above-described light emitting devices. The use of any of the above-described light emitting devices for the light source portion allows the light source portion to be manufactured readily and inexpensively, and light to be supplied with high outcoupling efficiency to the spatial light modulator. Consequently, an image display device capable of displaying bright images with high efficiency can be provided readily and inexpensively.

BRIEF DESCRIPTION OF THE DRAWINGS

The invention will be described with reference to the accompanying drawings, wherein like numbers reference like elements.

DETAILED DESCRIPTION OF EMBODIMENTS

Now, embodiments of the invention will be described in detail with reference to the accompanying drawings.

First Embodiment

Figure 1A:
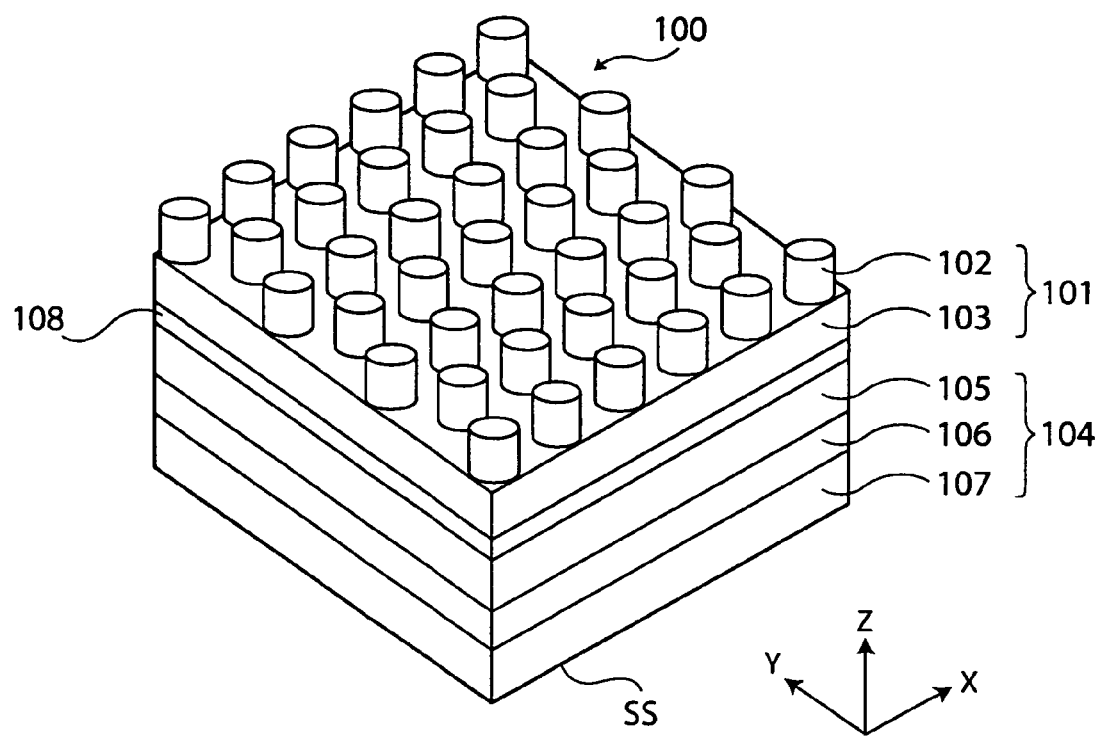
FIG. 1A is a perspective view of an essential part of an LED according to a first embodiment of the invention.

FIG. 1A is a perspective view of an essential part of an LED 100 as a light emitting device according to a first embodiment of the invention. The LED 100 has a light emitting portion 104 and an optical portion 101. The LED 100 is a surface-emitting type light source that discharges light mainly from the surface of the light emitting portion 104. The light emitting portion 104 is provided on a reference plane SS to supply light. The reference plane SS is a plane orthogonal to the Z-axis as the optical axis and an XY plane.

The light emitting portion 104 has a double-hetero structure including a p-type semiconductor layer 105, an active layer 106, and an n-type semiconductor layer 107. The p-type semiconductor layer 105, the active layer 106, and the n-type semiconductor layer 107 may be formed using for example a gallium nitride-based compound semiconductor. The LED 100 is provided in a so-called flip-chip package in which an electrode (not shown) is mounted on the opposite side to the output side for mounting the light emitting portion 104. Note that the light emitting portion 104 is not limited to the structure having the p-type semiconductor layer 105, the active layer 106, and the n-type semiconductor layer 107. The light emitting portion 104 may have a known structure such as a homo-junction structure other than the above. The p-type semiconductor layer 105, the active layer 106, and the n-type semiconductor layer 107 may be formed using a semiconductor other than the gallium nitride-based compound semiconductor.

On the output side of the light emitting portion 104, the optical portion 101 is provided with an adhesive layer 108 interposed therebetween. The optical portion 101 transmits light from the light emitting portion 104. The optical portion 101 includes a thin film 103 and a plurality of raised portions 102 provided thereon. The raised portions 102 and the thin film 103 are for example composed of a transparent silicon resin material. The silicon resin material may be for example a polymer having a molecular structure in which an alkyl or the like is coupled to a side chain of a siloxane bond (—Si—O—). The optical portion 101 can be formed in a film form separately from the light emitting portion 104, and then provided on the light emitting portion 104. The adhesive layer 108 is a transparent layer made of a cured transparent adhesive or the like and adheres the light emitting portion 104 and the optical portion 101.

The raised portion 102 has a cylindrical shape upright in the Z-axis direction that is approximately orthogonal to the reference plane SS. The raised portion 102 is provided on an XY plane (that is approximately parallel to the reference plane SS) and forms a regular triangle with two other adjacent raised portions. In view of one raised portion 102, there are six raised portions 102 around this raised portion 102. In this way, a plurality of raised portions 102 are arranged to form a triangular lattice, so that the raised portions 102 may be provided in a densely packed state. The raised portions 102 are arranged at a prescribed pitch about as long as the wavelength of light from the light emitting portion 104 to form a periodic structure. The optical portion 101 has two kinds of mediums having different refractive indexes in the XY-direction, i.e., the silicon resin material and the air by arranging the plurality of raised portions 102. In this way, the optical portion 101 has its refractive index periodically changed in the two-dimensional direction approximately parallel to the reference plane SS. Note that the plurality of raised portions 102 may be in a periodic arrangement at a prescribed pitch other than the triangular lattice arrangement described above.

Figure 1B:
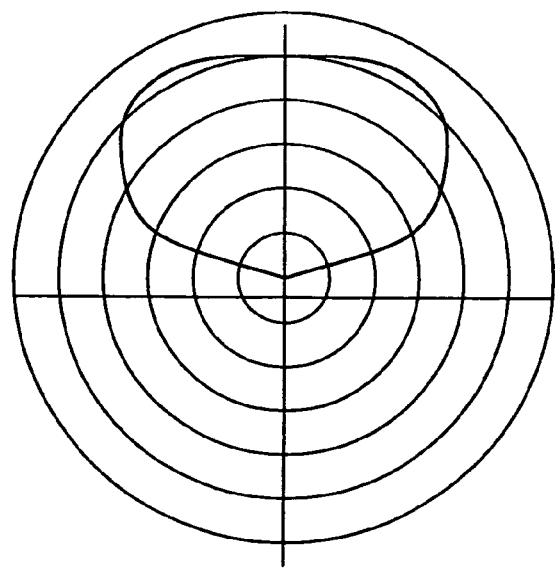
FIG. 1B shows the radiation distribution characteristic of a conventional LED.

FIG. 1B shows the radiation distribution characteristic of a conventional LED including a light emitting portion and a transparent substrate layered thereon. As can be seen from the circle graph, as the thick line is apart from the center of the circle, an increased amount of light advances in the angular direction. As can be seen, the LED produced simply by placing the transparent substrate on the light emitting portion supplies emitted light with a radiation distribution characteristic flattened in the horizontal direction. For example, if it is requested that light be efficiently supplied in the direction of an object for illumination as in the light source portion of an image display device, light cannot be supplied efficiently in the prescribed illumination direction by the LED.

In contrast, the use of the optical portion 101 having its refractive index periodically changed in the two-dimensional direction prevents light from the light emitting portion 104 from being absorbed into the light emitting portion 104, so that light can be supplied with high outcoupling efficiency. The optical portion 101 is formed to have approximately the same size as that of the light emitting portion 104, so that the outcoupling efficiency can be improved without increasing the area of the virtual image. The optical portion 101 can change light advancing at a large angle with respect to the optical axis to advance at a smaller angle with respect to the optical axis depending on its structure. Consequently, the optical portion 101 can efficiently supply light in a prescribed illumination direction with high outcoupling efficiency.

Figure 2:
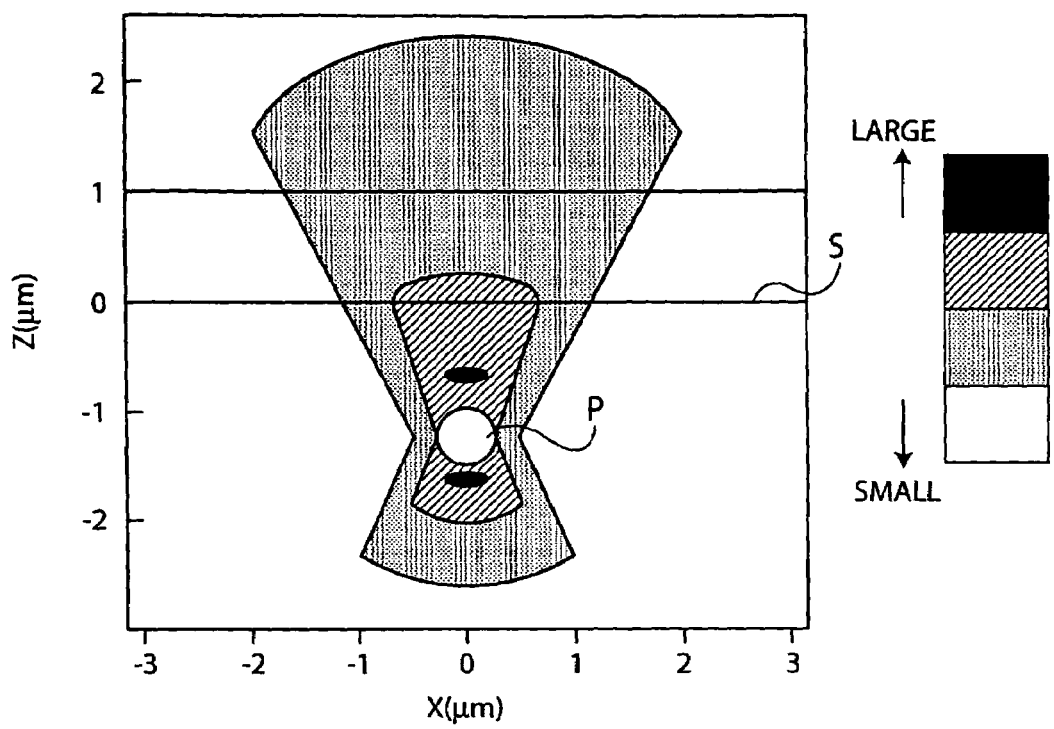
FIGS. 2 and 3 are graphs for use in illustrating changes in the radiation distribution characteristic of an LED when the device is provided with an optical portion.
Figure 3:
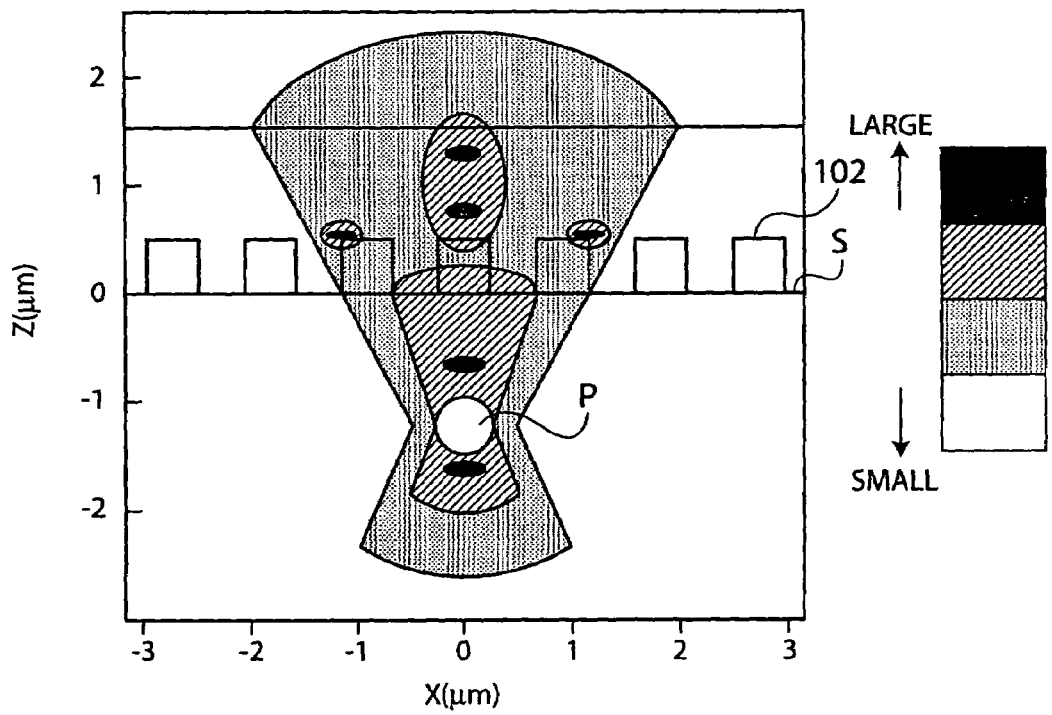

FIGS. 2 and 3 illustrate how the radiation distribution characteristic of the LED changes by providing the optical portion 101. FIG. 2 is a radiation distribution characteristic when the optical portion 101 is not provided, and FIG. 3 is the radiation distribution characteristic of the LED 100 according to the invention including the optical portion 101. In FIGS. 2 and 3, the optical intensity distribution on an XZ plane is shown in solid black, by hatching, by tone, and in blank in the descending order of intensity. FIG. 2 shows the intensity distribution of the light from the LED with respect to the plane of incidence of the light emitting portion 104 as the reference plane S, while FIG. 3 shows the distribution with respect to the surface on the output side of the thin film 103 provided with the raised portions 102 is the reference plane S. The region P is the part where light is supplied most intensively in the light emitting portion 104 and approximately in the central position of the light emitting portion 104 in the XY-direction. In view of FIGS. 2 and 3 in comparison, the optical portion 101 causes the radiation distribution characteristic to change so that the intensity of light advancing in the positive Z-direction from the region P increases.

Figure 4:
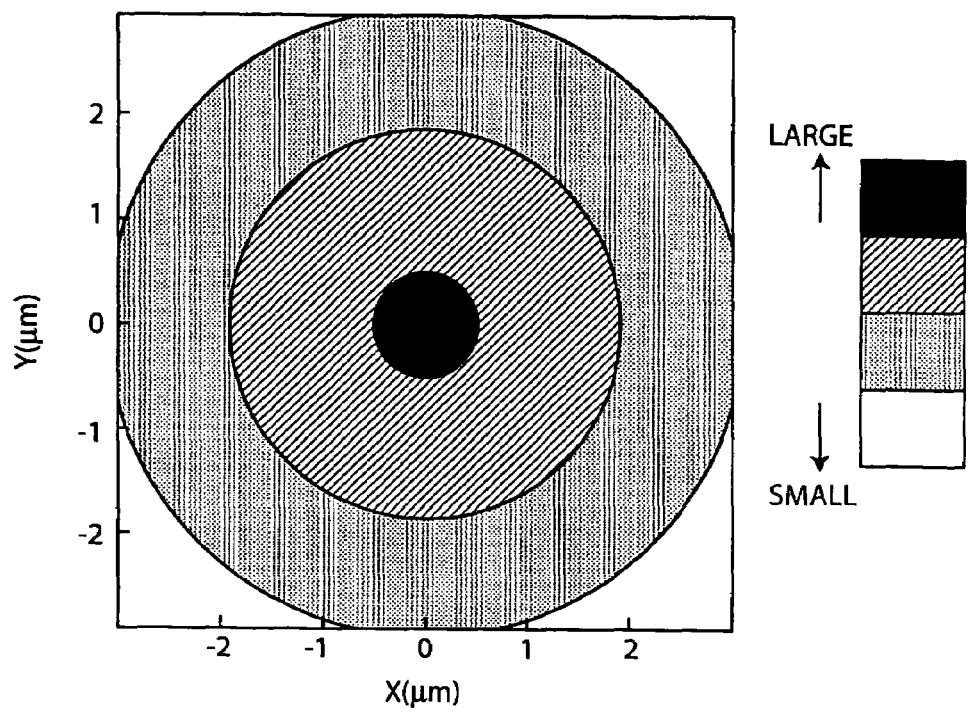
FIGS. 4 and 5 are graphs for use in illustrating changes in the radiation distribution characteristic in an XY plane.
Figure 5:
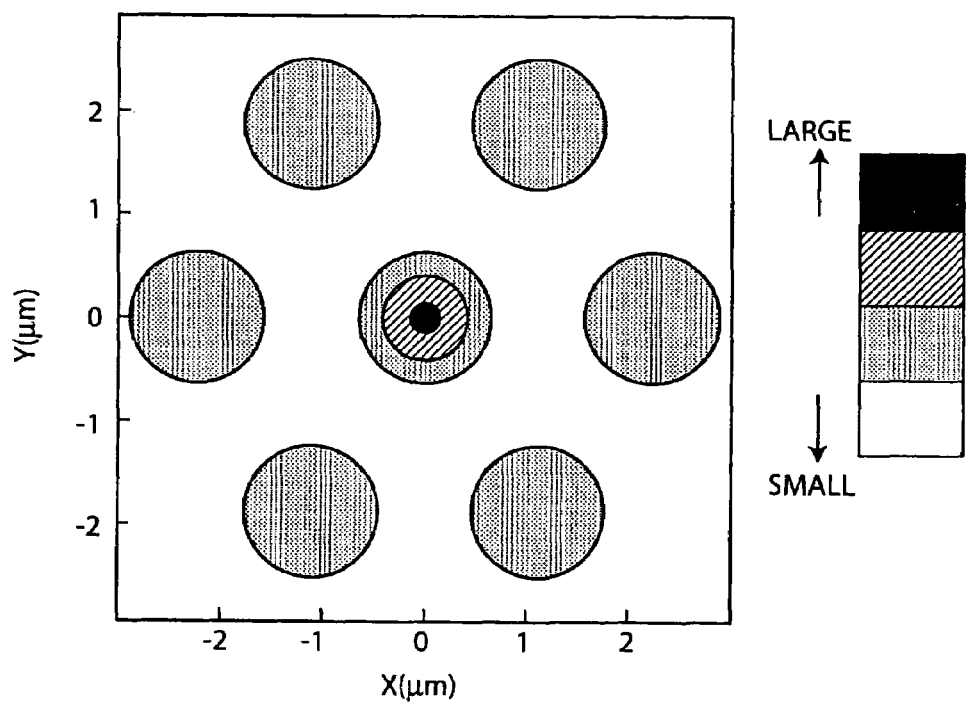

FIGS. 4 and 5 illustrate changes in the radiation distribution characteristic in an XP plane. FIG. 4 shows the radiation distribution characteristic described in conjunction with FIG. 2 viewed in an XP plane located 1 micrometers apart from the reference plane S to the output side. FIG. 5 shows the radiation distribution characteristic described in conjunction with FIG. 3 viewed in an XY plane located 1.5 micrometers apart from the reference plane S to the output side. In the XY plane shown in FIG. 5, a plurality of raised portions 102 are arranged. As can be seen from comparison between FIGS. 4 and 5, the optical portion 101 allows the light intensity to be concentrated in a very narrow angular range.

The raised portions 102 provided in the optical portion 101 are not limited to the shape as shown in FIG. 1A, and may be modified in shape. For example, when the raised portion 102 has a large length in the Z-axis direction, more light advancing in oblique directions can be angularly changed to advance in the Z-axis direction than the case in which the raised portion 102 has a short length in the Z-axis direction. Therefore, the raised portion 102 may have a larger length in the Z-axis direction than the shown length. The raised portion 102 may have a prism shape rather than the cylindrical shape.

The optical portion 101 is not limited to the arrangement having the raised portions 102, and a plurality of recessed portions having a depth in the Z-axis direction that is approximately orthogonal to the reference plane SS (see FIG. 1A) may be provided. The recessed portions provided in the optical portion 101 may be formed by transferring the shape of the raised portions 102. The optical portion 101 has its refractive index periodically changed in the two-dimensional direction approximately parallel to the reference plane SS when the recessed portions are provided instead of the raised portions 102. When the recessed portions are provided, light can efficiently be supplied in a prescribed illumination direction with high outcoupling efficiency. Other modifications of the optical portion 101 will later be described.

Figure 6:
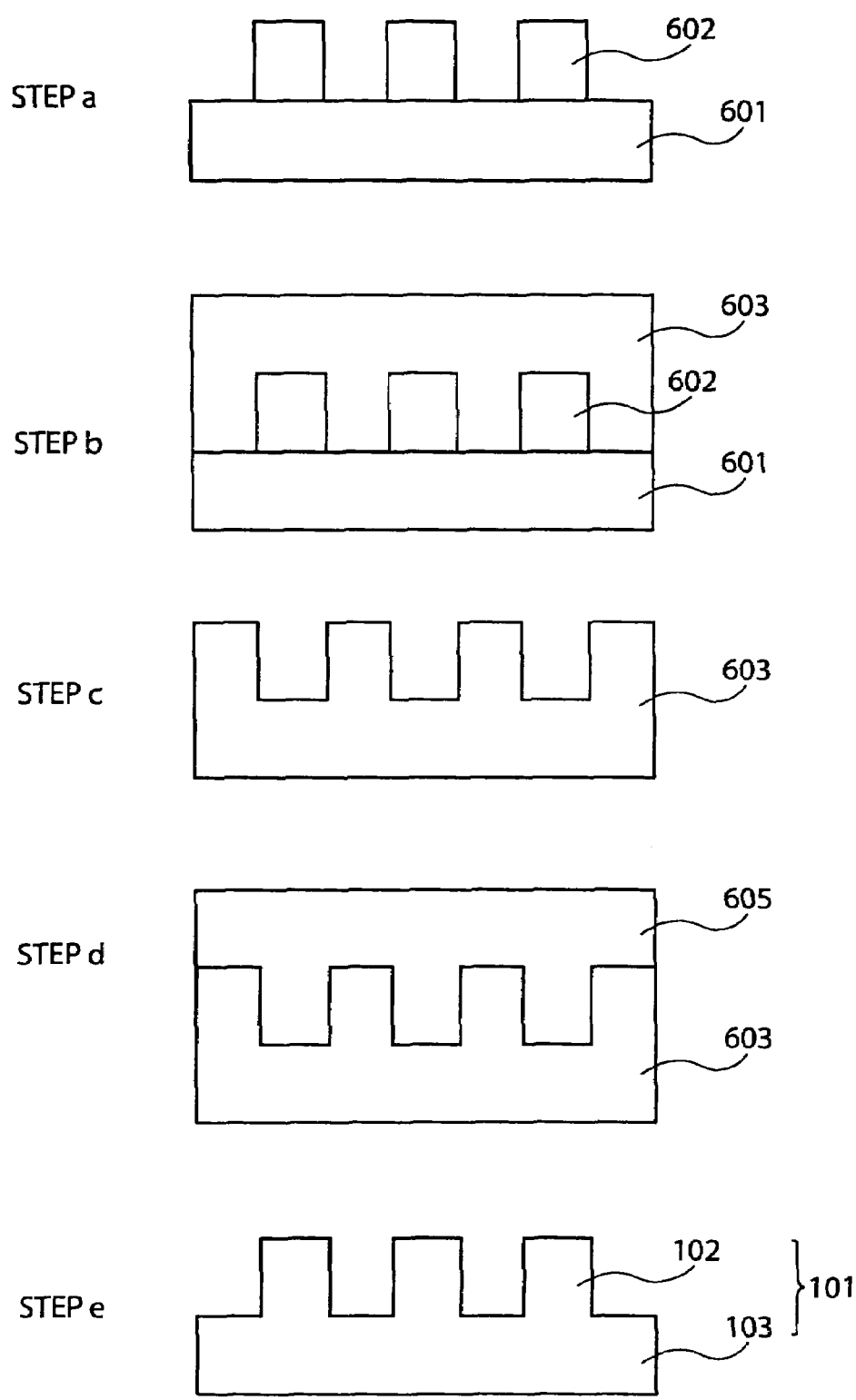
FIGS. 6 and 7 are views for use in illustrating the process of manufacturing an LED.
Figure 7:
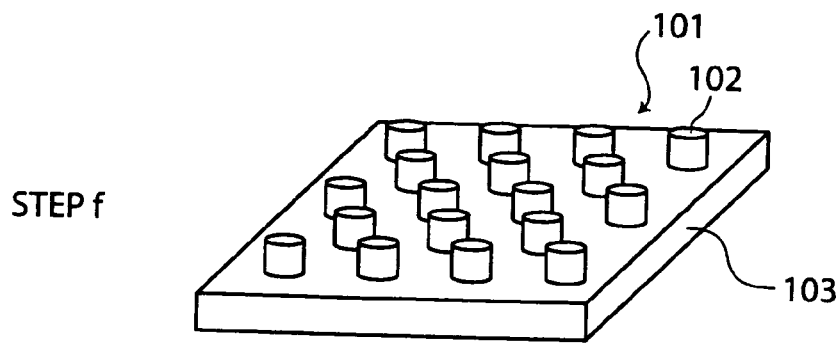
Figure 7:
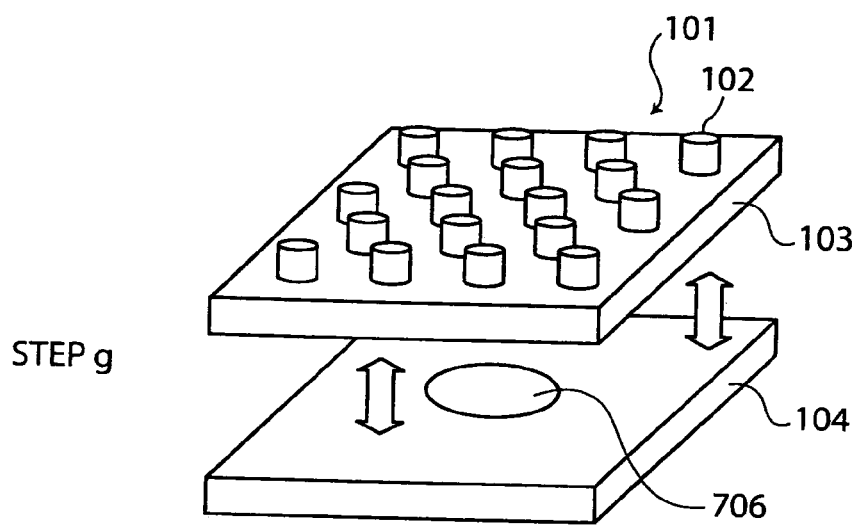
Figure 7:
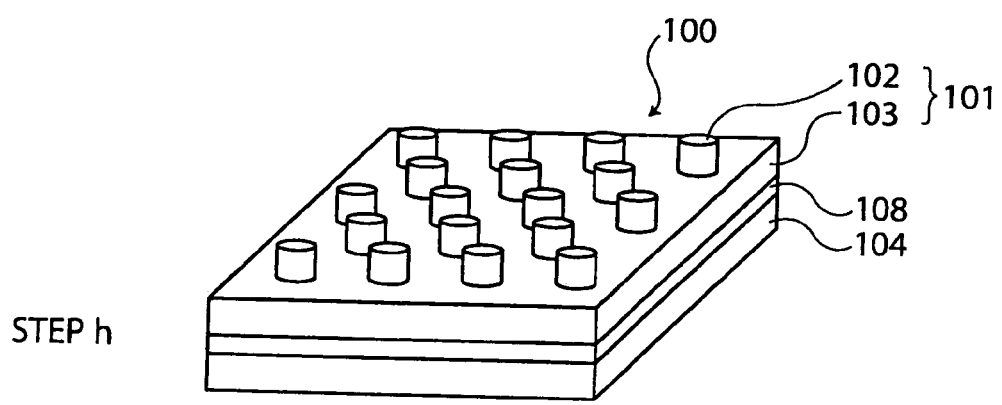

FIGS. 6 and 7 illustrate the process of manufacturing the LED 100. The steps a to e shown in FIG. 6 are the process of forming an optical portion 101 and in the process the optical portion is formed separately from the light emitting portion 104. The optical portion 101 in the LED 100 can be formed by a so-called nano-imprinting method, i.e., nano-scale application of press working with a die. According to the nano-imprinting method, a die with fine irregularities is pressed against a workpiece material such as a thin resin film, and a pattern having a width of several ten nanometers can be formed. The pattern is formed using the press, and therefore the working is more easily and inexpensively carried out than the nano-scale working using an electron beam.

In the process of forming the optical portion 101, a mold is formed in steps a to c. The mold can be formed for example by electroforming. In step a, a substrate 601 made of a glass material or the like is provided with a resist layer 602 in a prescribed shape thereon. In step b, a metal layer 603 is formed on the substrate 601 and the resist layer 602. The metal layer 603 may be made of a metal material such as nickel and copper. In step c, the substrate 601 and the resist layer 602 are removed from the metal layer 603, so that the mold having the prescribed shape transferred thereon is obtained. Note that the mold may be formed by process such as wet etching, dry etching, and laser working other than the electroforming described above.

Then, in steps d and e, using the metal layer 603 as the mold, transfer is carried out to the silicon resin layer 605 in the thin film state. In step d, using the metal layer 603, the silicon resin layer 605 is subjected to press working. Then, in step e, the metal layer 603 is removed and the silicon resin layer 605 is thermally cured. In this way, the film type optical portion 101 having the silicon resin material in a prescribed shape is obtained. The optical portion 101 may be formed as large as the LED 100 or may be formed larger and cut to have the size of the LED 100. The film type silicon resin material can easily be cut. In this way, a large number of optical portions 101 may be manufactured only by a single transfer operation.

Steps f to h shown in FIG. 7 are the process of layering the optical portion 101 on the light emitting portion 104. As shown in step f, the optical portion 101 having raised portions 102 formed in the two-dimensional direction is adhered onto the light emitting portion 104 by an adhesive 706 in step g. The adhesive 706 is a liquid or gel type transparent adhesive and is cured to form a transparent adhesive layer 108. In this way, the LED 100 shown in step h can be manufactured. Note that part of the optical portion 101 may be softened by heat and attached to the light emitting portion 104, so that the optical portion 101 and the light emitting portion 104 may be joined without using the adhesive 706.

Note that in the process of forming the optical portion, a mold may be produced for forming another mold by transfer, which is to be used for press working. In order to form the mold for forming the mold for the press working, in step a, a mold shape the same as the metal layer 603 shown in step c in FIG. 6 is formed by the substrate 601 and the resist layer 602. In this way, a mold having irregularities reversed in shape from those of the metal layer 603 in step c in FIG. 6 can be formed. The mold for forming the mold for press working is formed, so that if the mold for the press working is degraded, another mold for press working can easily be formed by transfer.

In the process of forming the optical portion, the optical portion 101 is formed separately from the light emitting portion 104, so that the yield can be improved as compared with the case of forming the optical portion 101 by carrying out working to each LED. Since limitations in forming the optical portion 101 are reduced as compared with the case of forming the optical portion 101 by carrying out working to each LED, the optical portion 101, working on which would hitherto be difficult, can be manufactured in volume by a simple method and inexpensively. The film type optical portion 101 can easily be formed by carrying out press working to a film material. In this way, a light emitting device capable of efficiently supplying light with high outcoupling efficiency in a prescribed illumination direction can be manufactured easily and inexpensively. The LED 100 according to the invention is useful for example as the light source of a projector.

The optical portion 101 is made of a heat-curing, silicon resin material, and therefore the silicon resin material after the pressing can easily be cured. The optical portion 101 made of a silicon resin material may have high environmental resistance to heat, light, humidity, and the like. In this way, the LED 100 can readily be formed and is allowed to have high environmental resistance. Note that the optical portion 101 may be made of a transparent material other than the silicon resin material. In addition, the optical portion 101 may be made for example of a thermoplastic material or a photo-curing material other than the heat-curing material described above. When a thermoplastic material or a photo-curing material is used, curing after pressing can easily be carried out.

Figure 8A:
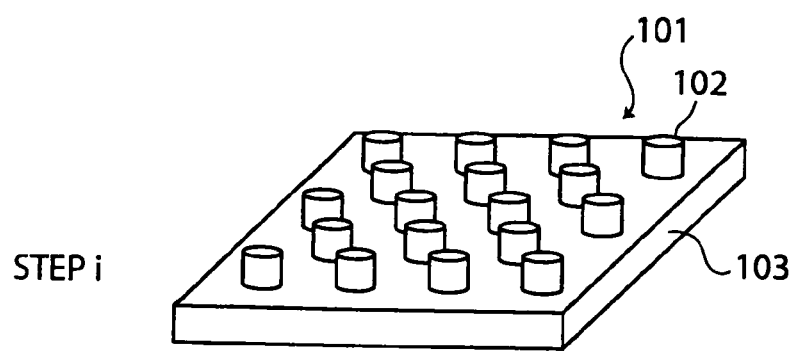
FIG. 8A is a view for use in illustrating the process of manufacturing an LED according to a modification of the first embodiment.
Figure 8A:
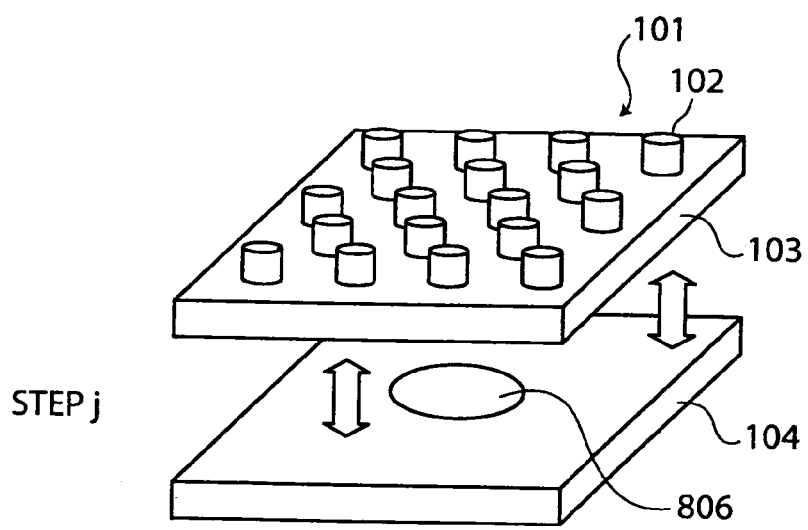
Figure 8A:
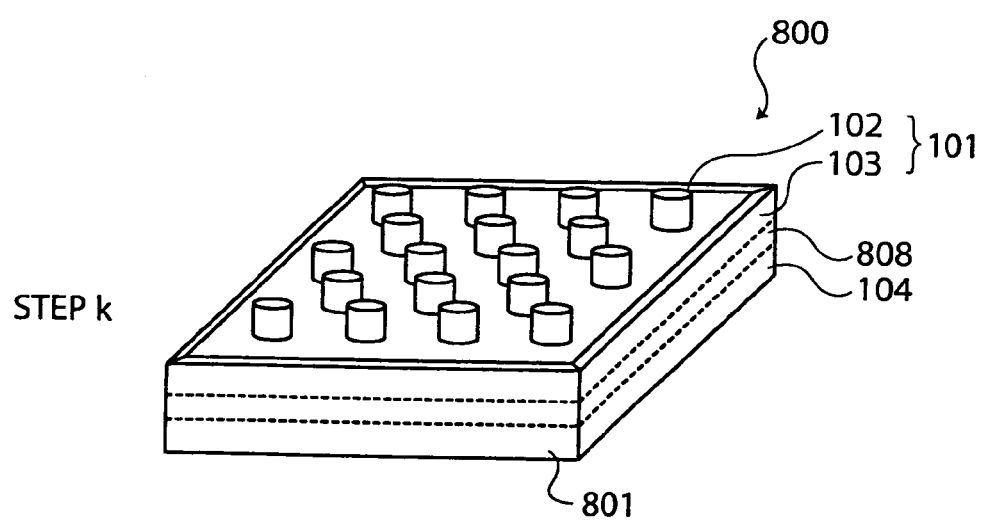

FIG. 8A shows the process of manufacturing an LED 800 as a light emitting device according to a modification of the embodiment. The LED 800 according to the modification has a buffer layer 808. In steps i to k shown in FIG. 8A are the process of layering the optical portion 101 on the light emitting portion 104. In the illustration of step i, the optical portion 101 has raised portions 102 arranged in the two-dimensional direction. The optical portion 101 is separately formed in the same manner as the above, and then in step j, the optical portion 101 is placed on the light emitting portion 104 through a fluid material 806. The fluid material 806 is a liquid or gel type transparent material such as an optical oil. In step k, the light emitting portion 104 and the optical portion 101 are supported by a support portion 801 provided around the light emitting portion 104 and the optical portion 101.

It is not necessary to precisely register the optical portion 101 and the light emitting portion 104, and the support portion 801 is provided in order to prevent large positional shifts between the optical portion 101 and the light emitting portion 104. The fluid material 806 turns into the buffer layer 808 including the fluid material as it is surrounded by the light emitting portion 104, the optical portion 101 and the support portion 801. In this way, the thus produced LED 800 can efficiently supply light in a prescribed illumination direction with high outcoupling efficiency.

The buffer layer 808 provided between the light emitting portion 104 and the optical portion 101 buffers changes in size between the light emitting portion 104 and the optical portion 101. The buffer layer 808 provided between the light emitting portion 104 and the optical portion 101 reduces distortions between these portions and makes them less susceptible to damages. In particular, the presence of the buffer layer 808 reduces degradation in terms of the structure of the LED 800 even when the LED 800 operates at high output level. In this way, the LED 800 can be used for a long period and is less susceptible to damages during its useful life.

Figure 8B:
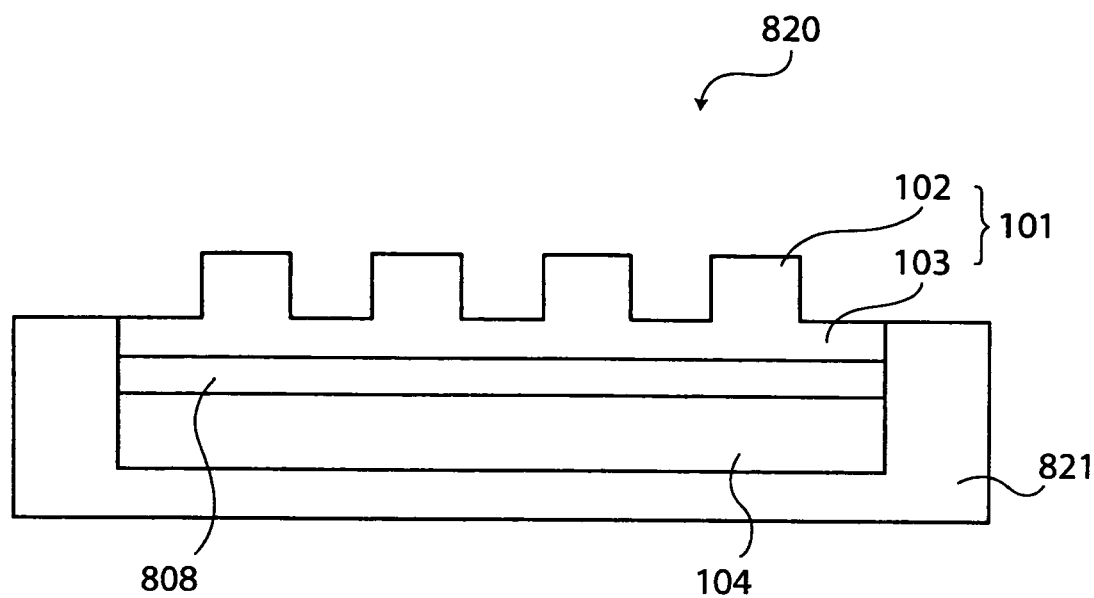
FIG. 8B is a view for use in illustrating how a substrate that can support an optical portion and a light emitting portion is used.

In order to prevent positional shifts between the optical portion 101 and the light emitting portion 104, measures other than the use of the support portion 801 may be taken. For example, as in an LED 820 as shown in FIG. 8B, a substrate 821 that can support the optical portion 101 and the light emitting portion 104 may be employed. The optical portion 101 and the light emitting portion 104 are fitted into a groove portion provided in the substrate 821 and fixed therein. The substrate 821 having such a groove can be formed for example by etching a parallel flat plate.

Note that the buffer layer 808 may be formed of a material having a refractive index substantially the same as that of the transparent material forming the optical portion 101. For example, when the optical portion 101 is made of transparent resin having a refractive index of about 1.5 such as acrylic resin or a cycloolefin polymer, the buffer layer 808 may be made of an emulsion oil having a refractive index of about 1.5. In this way, the loss of light at the interface between the buffer layer 808 and the optical portion 101 can be reduced. Alternatively, the buffer layer 808 may be made of a material having a refractive index in the range between the refractive index of the transparent material forming the optical portion 101 and the refractive index of the transparent material forming the transparent substrate (not shown) used for the light emitting portion 104. For example, when the optical portion 101 is made of transparent resin having a refractive index of about 1.5, and the transparent substrate (not shown) used for the light emitting portion 104 is made of a sapphire material having a refractive index of about 1.7, a liquid for immersion exposure having a refractive index in the range from 1.5 to 1.7 can be used for the buffer layer 808. In this way, the loss of light may be reduced at the interfaces between the light emitting portion 104 and the buffer layer 808 and between the buffer layer 808 and the optical portion 101.

Figure 9:
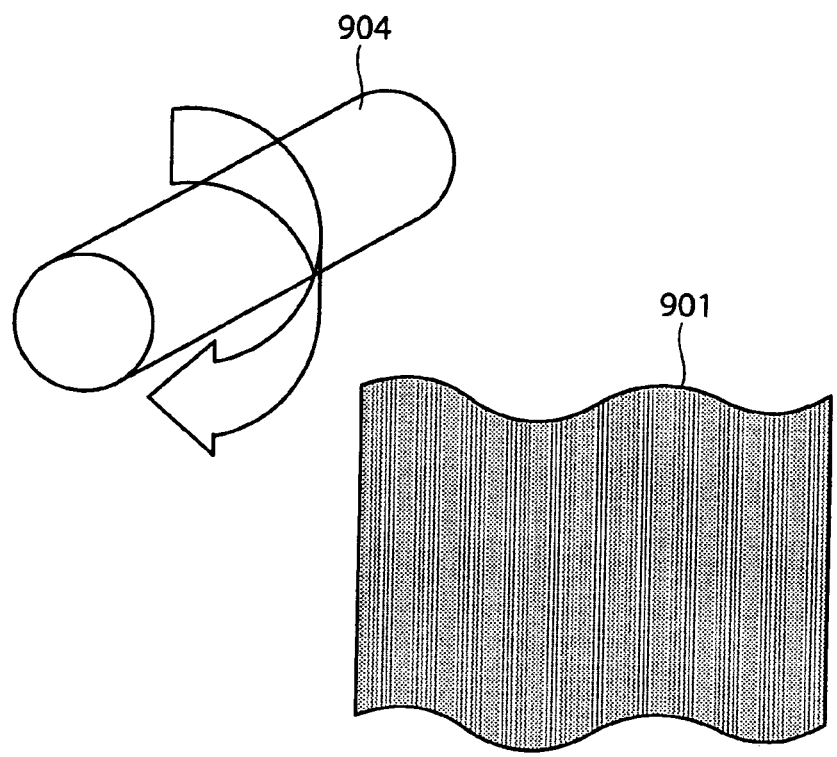
FIGS. 9 and 10 are views for use in illustrating an example of arrangement in which a light emitting portion with a curved surface and an optical portion are combined.
Figure 10:
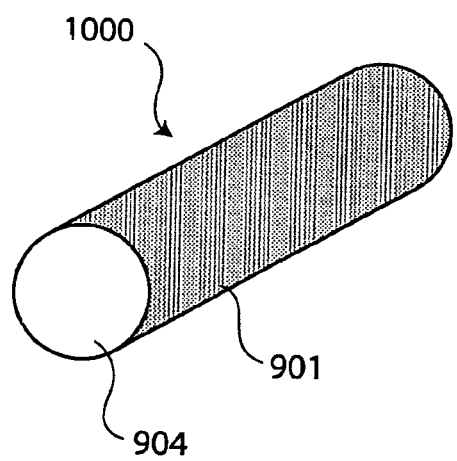

The optical portion according to the embodiment may be combined not only with a light emitting portion having an approximately flat plane of output like the light emitting portions 104 in the LEDs 100, 800, and 820 but also with a light emitting portion 904 having a curved plane of output as shown in FIG. 9. The light emitting portion 904 is for example a fluorescent lamp having a cylindrical shape and supplies light from the curved surface of the cylinder. A film type optical portion 901 is wrapped around the light emitting portion 904, so that a fluorescent light emitting device 1000 as shown in FIG. 10 can be formed. The optical portion 901 is provided on the output side of the light emitting portion 904 and transmits light from the light emitting portion 904. The structure and operation of the optical portion 901 are the same as those of the optical portion 101 provided in the LED 100 described above. In this way, with the fluorescent light emitting device 1000, light can be supplied with high outcoupling efficiency similarly to the LED 100 described above.

The film shaped optical portion 901 can be applied to a light emitting device having a curved surface, working on which would hitherto be considered difficult. In this way, the use of the film-shaped optical portion 901 significantly improves the usefulness and versatility for applying the optical portion 901 to the light emitting device. Therefore, the light emitting device can be manufactured readily and inexpensively. The optical portion 901 can be applied not only to the light emitting device having the cylindrical light emitting portion 904 but also to other light emitting devices having curved surfaces or complex shapes.

Figure 11:
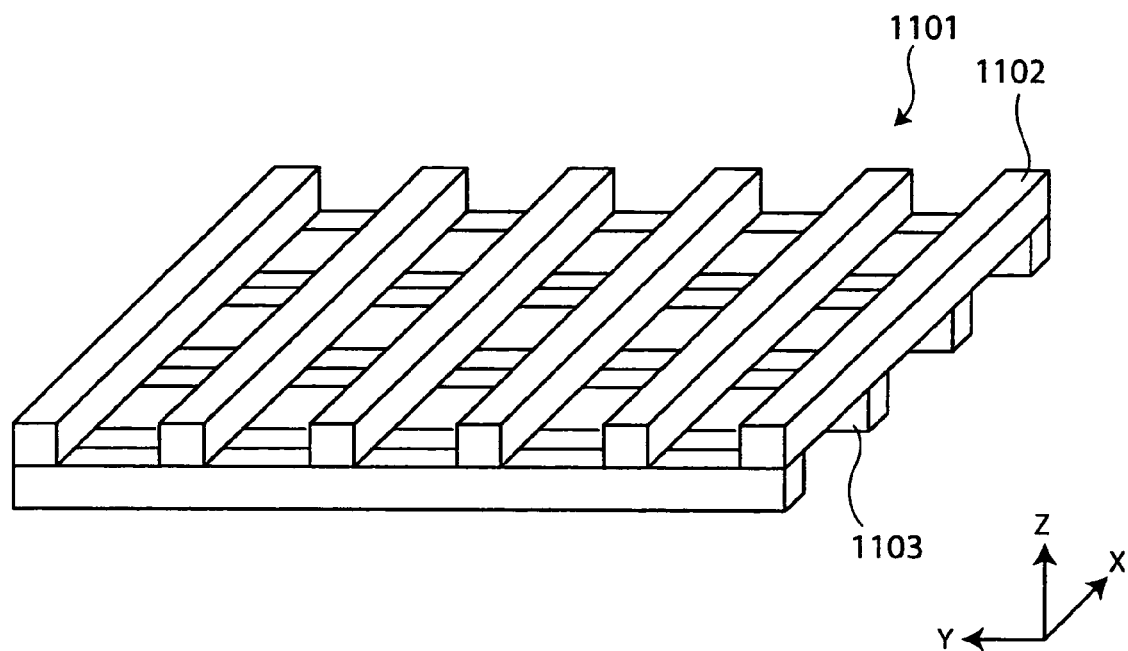
FIG. 11 is a perspective view of an essential part of an optical portion according to a modification of the first embodiment.

FIG. 11 is a perspective view of an essential part of an optical portion 1101 according to a modification of the embodiment. The optical portion 1101 according to the modification can be applied to the above described LEDs 100, 800, and 820. The optical portion 1101 has a three-dimensional structure including optical devices 1102 and 1103 at the plane of incidence and the plane of output. The optical devices 1103 provided at the plane of incidence of the optical portion 1101 are elongated in the Y-axis direction and aligned in the X-axis direction. The optical devices 1102 provided at the plane of output of the optical portion 1101 are elongated in the X-axis direction and aligned in the Y-axis direction. The optical portion 1101 can efficiently supply light with high outcoupling efficiency in a prescribed illumination direction similarly to the optical portion 101 described above.

It is considerably difficult to manufacture the optical portion 1101 having a three dimensional structure when working is carried out directly to the LED. Meanwhile, when the optical portion 1101 is formed separately from the light emitting portion, the optical portion 1101 can readily be formed for example by carrying out press-working to the front and back surfaces of a thin film shaped material. In this way, according to the invention, the limitations in forming the optical portion 1101 can be reduced, and the optical portion 1101, working on which would hitherto be difficult, can be manufactured in volume by a simple method and inexpensively.

Second Embodiment

Figure 12:
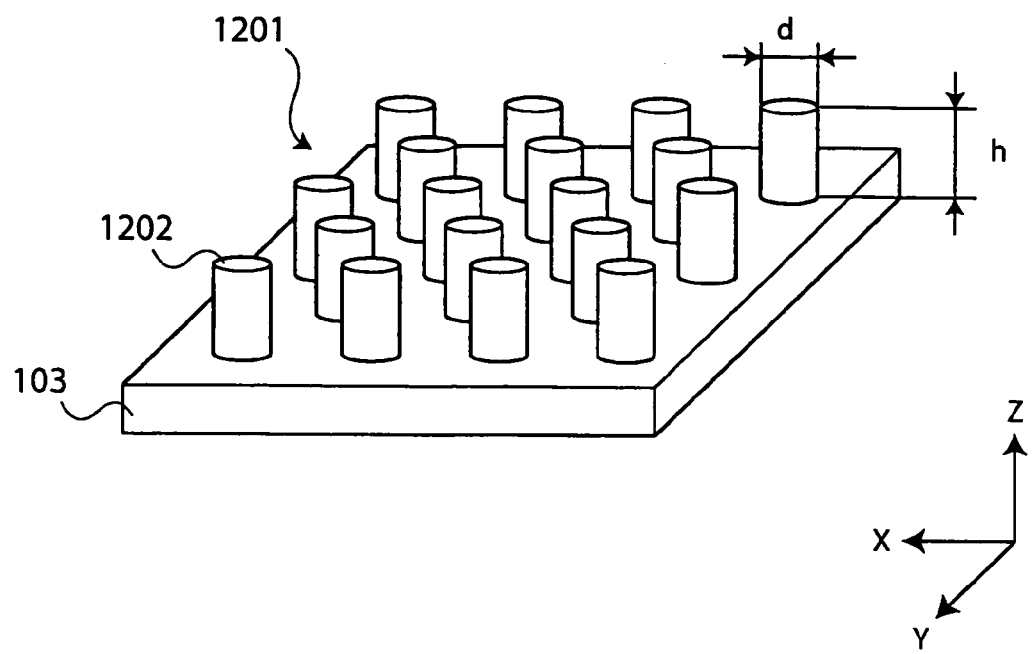
FIG. 12 is a perspective view of an essential part of an optical portion according to a second embodiment of the invention.

FIG. 12 is a perspective view of an essential part of an optical portion 1201 provided in an LED as a light emitting device according to a second embodiment of the invention. In conjunction with the embodiment, the structure of the optical portion 1201 for obtaining a good radiation characteristic will be described. The raised portions 1202 of the optical portion 1201 are each formed so that the height h of the cylinder is 1380 nm, and the diameter d of the cylinder is 550 nm. The ratio produced by dividing the height h of the cylinder by the diameter d will be referred to as "aspect ratio." The aspect ratio of the raised portion 1202 is about 2.5.

Figure 13:
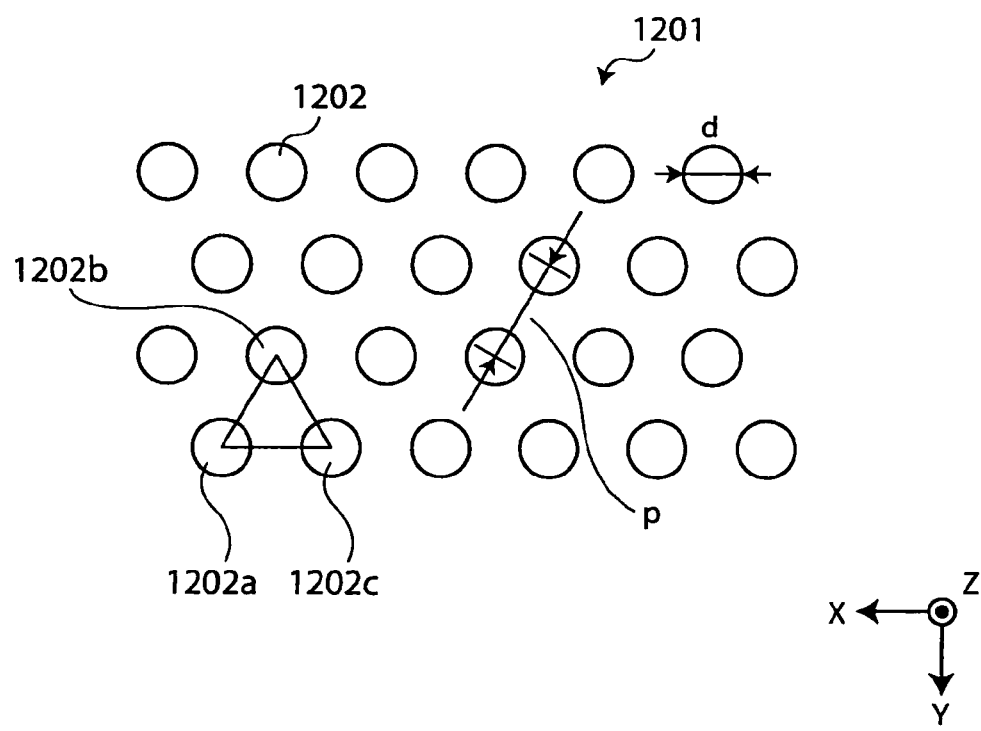
FIG. 13 shows the arrangement of raised portions on an XY plane.

FIG. 13 is a plan view showing the arrangement of the raised portions 1202 on an XY plane. In the optical portion 1201, the raised portions 1202 are arranged at a pitch p of 700 nm. In the optical portion 1201, the ratio produced by dividing the diameter d of the cylinder of the raised portion 1202 by the pitch p is about 0.79. The raised portions 1202 are arranged on an XY plane approximately parallel to the reference plane SS so that one raised portion 1202a and the other two raised portions 1202b and 1202c adjacent to the raised portion 1202a form a regular triangle. In view of one raised portion 1202b, there are six raised portions 1202 around this raised portion 1202b. In this way, the raised portions 1202 are arranged to form a triangular lattice on the XY plane, so that the optical portion 1201 has the raised portions 1202 in a densely packed state.

Figure 14:
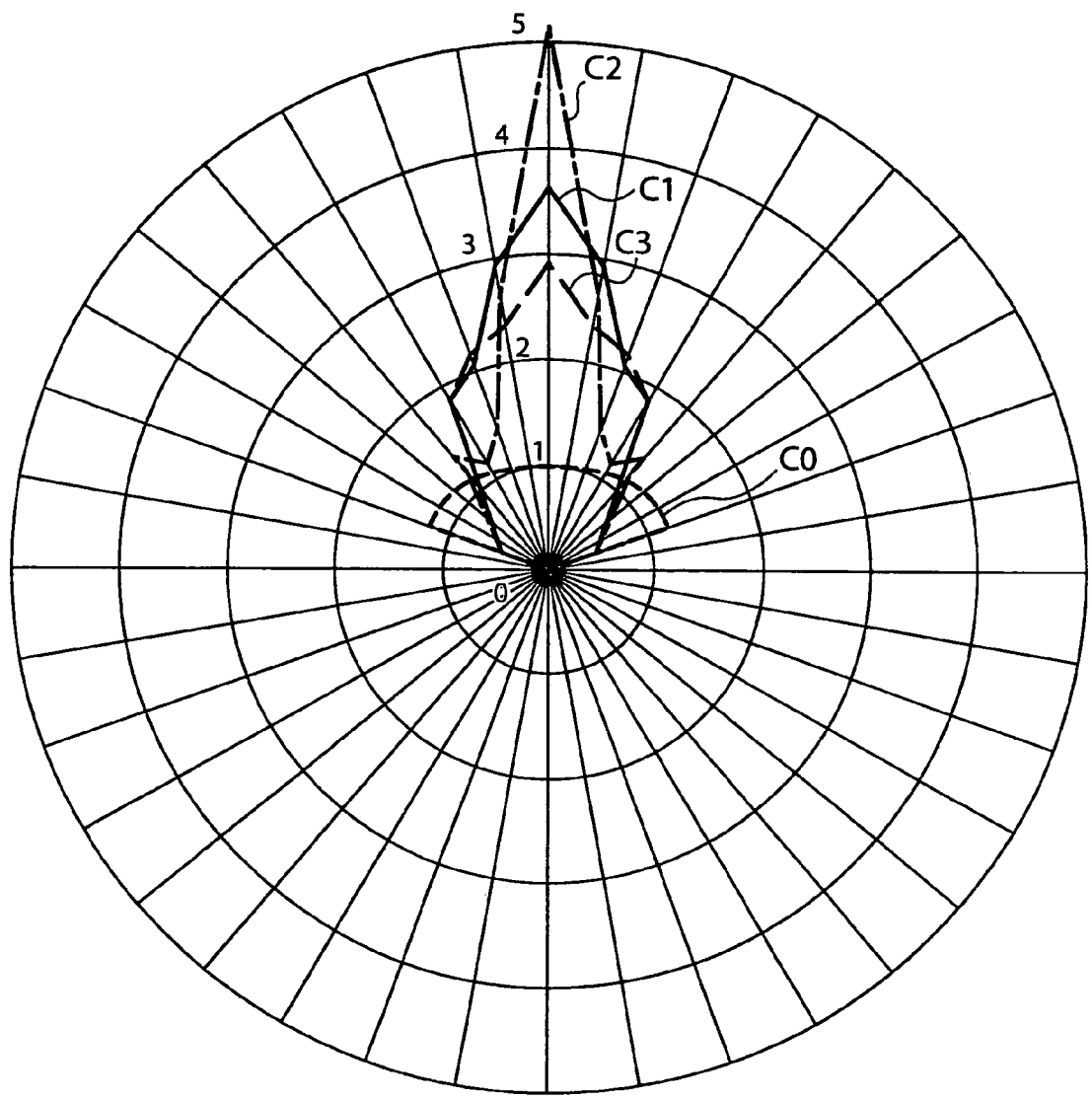
FIG. 14 is a graph showing the radiation distribution characteristic of an LED.

FIG. 14 is a graph showing the radiation distribution characteristic C0 of a conventional LED and the radiation distribution characteristic C1 and the like of the LEDs using the optical portion 1201 according to the embodiment. The radiation distribution characteristic C0 is obtained by the LED including the light emitting portion 104 and a transparent substrate placed thereon, and corresponds to the radiation distribution characteristic shown in FIG. 1B. As can be understood from comparison between the two radiation characteristics C0 and C1, the characteristic by the LED according to the embodiment allows more light to advance toward the optical axis than the conventional LED. In the LED according to the embodiment, the brightness in the direction of the optical axis is about 3.5 times that of the conventional LED.

In comparison with the conventional device, the outcoupling efficiency of the entire LED according to the embodiment is about 1.0 times, while the absolute quantity of light in the angular range of ±30° with respect to the direction of the optical axis can be about 2.1 times as much. The ratio of the quantity of light that can be output in the angular range of ±30° with respect to the direction of the optical axis to the total light quantity of the LED is 22% in the conventional arrangement, while the ratio can be as large as 47% according to the embodiment. In this way, according to the embodiment, light advancing approximately parallel to the optical axis is allowed to increase and a good radiation characteristic can be obtained.

For example, in an optical system in a projector including a light source portion and a spatial light modulator, the spatial extent of a flux can be represented as a product of the area of light emission and the angle of radiation (etendue or geometrical extent). The spatial light modulator can effectively modulate light only in a limited range of beam angles (for example within the range of ±16° with respect to the optical axis). In order to efficiently make the most of light from the light source portion at the spatial light modulator, the etendue at the light source portion should be smaller than the etendue at the spatial light modulator. According to the embodiment, light advancing approximately parallel to the optical axis is increased, and a good radiation characteristic is obtained, so that the etendue can be reduced. Therefore, the light emitting device according to the embodiment is advantageously applied in efficient display of bright images in a projector.

Note that the height h, diameter d, and pitch p of the raised portions 1202 forming the optical portion 1201 may be other than those described and the height h and diameter d of the raised portions 1202 may be set as desired so that the aspect ratio of each of the raised portion 1202 is about 2.5. The aspect ratio of the raised portion 1202 is not necessarily limited to about 2.5, and needs only be in the range from 2 to 3. The ratio produced by dividing the diameter d of the raised portion 1202 by the pitch p is not necessarily limited to about 0.79, but needs only be in the range from 0.65 to 0.85. The pitch p can be any value in the range from 500 nm to 2000 nm.

Now, two modifications will be described. According to a first modification, raised portions 1202 having a height h of 2530 nm and a diameter d of 1010 nm regarding the cylindrical shape are arranged at a pitch p of 1300 nm. The aspect ratio of the raised portion 1202 is about 2.5. The ratio produced by dividing the diameter d by the pitch p is about 0.78. As shown in FIG. 14, the brightness in the direction of the optical axis in the radiation distribution characteristic C2 according to the first modification is about five times that in the conventional radiation distribution characteristic C0. In comparison to the conventional example, the outcoupling efficiency of the entire LED according to the modification is about 0.9 times as large, while the absolute quantity of light in the angular range of ±30° with respect to the optical axis can be about 1.6 times as large. The ratio of quantity of light that can be output in the angular range of ±30° with respect to the optical axis to the total light quantity of the LED can be increased to 36% according to the modification.

According to a second modification, raised portions 1202 having a height h of 1110 nm and a diameter d of 550 nm regarding the cylindrical shape are arranged at a pitch p of 700 nm. The aspect ratio of the raised portion 1202 is about 2.0. The ratio produced by dividing the diameter d by the pitch p is about 0.79. As shown in FIG. 14, the brightness in the direction of the optical axis in the radiation distribution characteristic C3 according to the second modification is about three times that in the conventional radiation distribution characteristic C0. In comparison with the conventional example, the outcoupling efficiency of the entire LED according to the modification is about 1.1 times as large, while the absolute quantity of light in the angular range of ±30° with respect to the optical axis can be about 2.1 times as large. The ratio of quantity of light that can be output in the angular range of ±30° with respect to the optical axis to the total light quantity of the LED can be increased to 43% according to the modification.

Figure 15:
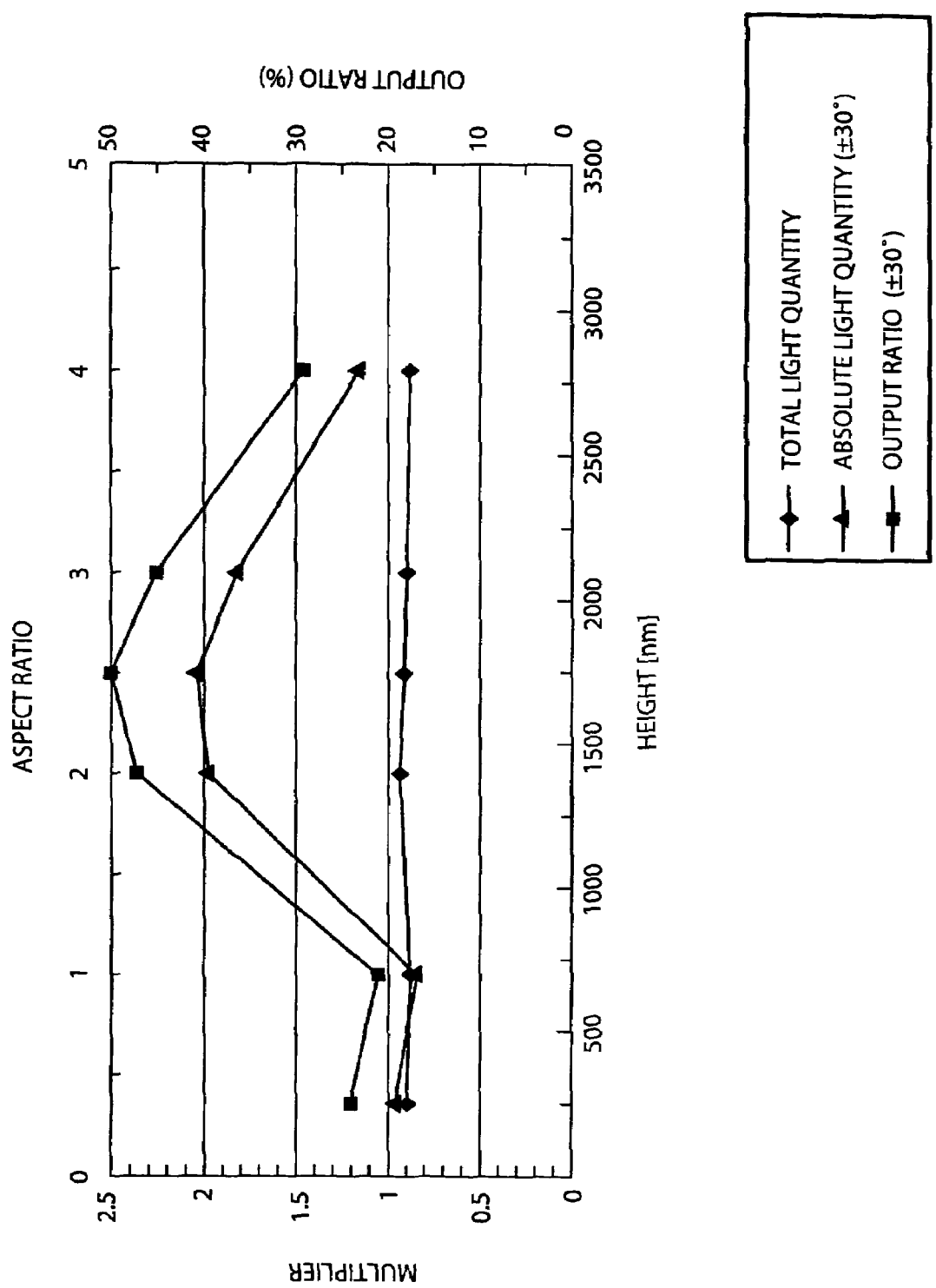
FIG. 15 is a graph for use in illustrating the relation between the characteristic of the LED and the aspect ratio of the raised portion.

FIG. 15 shows the relation between the total light quantity of the LED, the absolute light quantity in the angular range of ±30°, and the output ratio in the angular range of ±30°, and the aspect ratio of the raised portion 1202. The total light quantity of the LED, and the absolute light quantity in the angular range of ±30° are both represented as multipliers for those of the conventional LED including the light emitting portion 104 and a transparent substrate layered thereon. These multipliers are shown on the left scale on the graph. The output ratio in the angular range of ±30° is represented by the ratio of the quantity of light that can be output at ±30° to the total light quantity of the LED. The ratio is shown on the right scale on the graph. Herein, the diameter d of the raised portions 1202 is fixed at 700 nm, and the height h is varied. The plurality of raised portions 1202 are arranged at a pitch p of 900 nm.

As can be seen from the graph shown in FIG. 15, when the aspect ratio of the raised portion 1202 is in the range from 2 to 3, particularly 2.5, the absolute light quantity in the angular range of ±30° and the ratio of quantity of light that can be output in the angular range of ±30° are higher. Therefore, using the raised portions 1201 formed with the raised portion 1202 whose aspect ratio produced by dividing the height h by the diameter d is in the range from 2 to 3, particularly about 2.5, an increased amount of light is allowed to advance in a direction approximately parallel to the optical axis, and a good radiation characteristic can be obtained.

According to the embodiment, the optimum values for the height h, diameter d, and the pitch p of the raised portions 1202 forming the optical portion 1201 are calculated, provided that light is G light that has an optical wavelength of 525 nm. As for R light and B light other than G light, the raised portions 1202 are formed based on the numerical values within the range of the described embodiment, so that an increased amount of light can be advanced in a direction approximately parallel to the optical axis, and a good radiation characteristic can be obtained.

Third Embodiment

Figure 16:
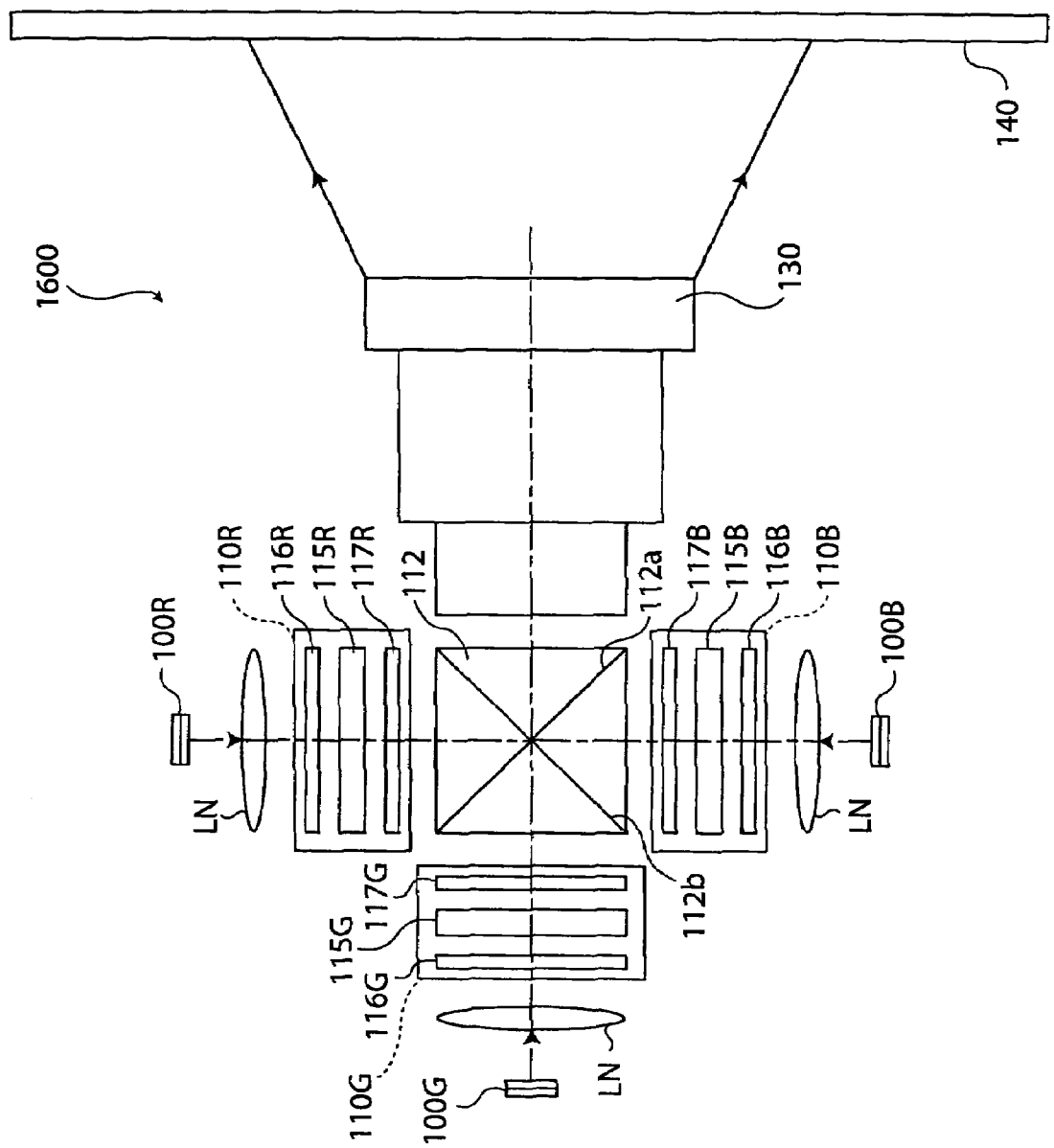
FIG. 16 is a schematic view of the structure of a projector according to a third embodiment of the invention.

FIG. 16 is a schematic view of the general structure of a projector 1600 as an image display device according to a third embodiment of the invention. The projector 1600 includes light source portions 100R, 100G, and 100B that supply R light, G light, and B light, respectively. The light source portions 100R, 100G, and 100B have the same structure as that of the LED 100 according to the first embodiment. The R light from the light source portion 100R is transmitted through a lens LN and comes into a spatial light modulator 110R. The spatial light modulator 110R is a transmission type liquid crystal display device that modulates the R light in response to an image signal. The spatial light modulator 110R includes a liquid crystal panel 115R, and first and second sheet polarizers 116R and 117R.

The first sheet polarizer 116R transmits p-polarized light in the R light and allows the light to come into the liquid crystal panel 115R. A polarization conversion device may be provided between the light source portion 100R and the first sheet polarizer 116R. In this way, the polarization conversion device may convert polarized light in the oscillation direction other than p-polarized light such as s-polarized light into p-polarized light. The liquid crystal panel 115R modulates p-polarized light in response to an image signal and converts the light into s-polarized light. The second sheet polarizer 117R emits the R light converted into the s-polarized light by the liquid crystal panel 115R. In this way, the spatial light modulator 10R modulates the R light from the light source portion 101R in response to an image signal. The R light converted into the s-polarized light by the spatial light modulator 110R is allowed to come into a cross-dichroic prism 112.

The G light from the light source portion 100G is transmitted through a lens LN and comes into the spatial light modulator 10G. The spatial light modulator 110G is a transmission type liquid crystal display device that modulates the G light in response to an image signal. The spatial light modulator 110G includes a liquid crystal panel 115G and first and second sheet polarizers 116G and 117G. The first sheet polarizer 116G transmits s-polarized light in the G light and allows the light to come into the liquid crystal panel 115G. A polarization conversion device may be provided between the light source portion 100G and the first sheet polarizer 116G. In this way, the polarization conversion device may convert polarized light in the oscillation direction other than s-polarized light such as p-polarized light into s-polarized light. The liquid crystal panel 115G modulates the s-polarized light in response to an image signal and converts the light into p-polarized light. The second sheet polarizer 117G emits the G light converted into the p-polarized light by the liquid crystal panel 115G. In this way, the spatial light modulator 110G modulates the G light from the light source portion 100G in response to an image signal. The G light converted into the p-polarized light by the spatial light modulator 110G is allowed to come into the cross-dichroic prism 112 from a plane different from the plane to which the R light enters.

The B light from the light source portion 100B is transmitted through a lens LN and comes into the spatial light modulator 110B. The spatial light modulator 10B is a transmission type liquid crystal display device that modulates the B light in response to an image signal. The spatial light modulator 110B includes a liquid crystal panel 115B and first and second sheet polarizers 116B and 117B. The first sheet polarizer 116B transmits p-polarized light in the B light and allows the light to come into the liquid crystal panel 115B. A polarization conversion device may be provided between the light source portion 100B and the first sheet polarizer 116B. In this way, the polarization conversion device may convert polarized light in the oscillation direction other than p-polarized light such as s-polarized light into p-polarized light. The liquid crystal panel 115B modulates the p-polarized light in response to an image signal and converts the light into s-polarized light. The second sheet polarizer 117B outputs the B light thus converted into the s-polarized light by the liquid crystal panel 115B. In this way, the spatial light modulator 110B modulates the B light from the light source portion 101B in response to an image signal. The B light converted into the s-polarized light by the spatial light modulator 110B is allowed to come into the cross-dichroic prism 112 from a plane different from the planes to which the R light and the G light enter.

The cross-dichroic prism 112 as a color combining optical system has two dichroic films 112a and 112b. The dichroic films 112a and 112b are provided orthogonal to each other in an X-shape. The dichroic film 112a reflects R light that is s-polarized light, and transmits G light that is p-polarized light. The dichroic film 112b reflects B light that is s-polarized light, and transmits G light that is p-polarized light. In this way, the cross dichroic prism 112 combines the R light, G light, and B light modulated by the spatial light modulators 110R, 110G, and 110B, respectively. A projection lens 130 projects the light combined by the cross dichroic prism 112 on a screen 140.

The dichroic films 112a and 112b generally have a high reflection characteristic to s-polarized light. Therefore, according to the embodiment, the R light and B light to be reflected by the dichroic films 112a and 112b, respectively are converted into s-polarized light and come into the cross dichroic prism 112. The G light to be transmitted through the dichroic films 112a and 112b come into the cross-dichroic prism 112 as p-polarized light.

Note that according to the embodiment, the light source portions 100R, 100G, and 100B allow light to come into the spatial light modulators 110R, 110G, and 110B, respectively through the lenses LN. Alternatively, the sizes of the output apertures of the light source portions 100R, 100G, and 100B may correspond to the spatial light modulators 110R, 110G, and 110B, respectively, so that the light from the light source portions 100R, 100G, and 100B may be allowed to directly come into the spatial light modulators 110R, 110G, and 110B.

Using the LED 100 as described above for each of the light source portions 100R, 100G, and 100B, the light source portions 100R, 100G, and 100B can be manufactured readily and inexpensively, and light can be supplied to the spatial light modulators 110R, 110G, and 110B with high efficiency. Consequently, the projector 1600 can be manufactured readily and inexpensively, and bright images can be displayed with high efficiency.

Note that the projector 1600 employs a transmission type liquid crystal display device but a reflection type liquid crystal display device or a tilt mirror device may be used. The light emitting device according to the invention is applicable not only to the light source portions of the front projection type projector but also to light source portions in a rear projection type projector. In addition, the light emitting device according to the invention may be a solid state light emitting device such as an EL device and a semiconductor laser other than the LED described above.

As in the foregoing, an optical device according to the invention is advantageously applied when bright light is to be supplied with high light use efficiency, and the device is particularly advantageous in application to an illumination optical system such as a system for use in a projector where the system is made in combination with a lens.

What is claimed is:

1. A light emitting device, comprising:
   a light emitting portion provided on a reference plane to supply light, the light emitting portion having an output side; and
   an optical portion having a refractive index, the optical portion provided on the output side of said light emitting portion to transmit light from said light emitting portion, said optical portion being formed so that the refractive index of the optical portion periodically changes in a two-dimensional direction approximately parallel to said reference plane, and the optical portion capable of being formed separately from said light emitting portion.

2. The light emitting device according to claim 1, said optical portion including a plurality of raised portions having a height in a direction approximately orthogonal to said reference plane.

3. The light emitting device according to claim 1, said optical portion being formed in a film state.

4. The light emitting device according to claim 1, said optical portion having a silicon resin material.

5. The light emitting device according to claim 1, further comprising:
   a buffer layer that includes a fluid material, said buffer layer being provided between said light emitting portion and said optical portion.

6. The light emitting device according to claim 2, said plurality of raised portions having an approximately cylindrical shape.

7. The light emitting device according to claim 6, said plurality of raised portions being positioned such that one raised portion of the said plurality of raised portions and two other raised portions of the said plurality of raised portions adjacent to the said one raised portion form a triangle on a plane approximately parallel to said reference plane.

8. The light emitting device according to claim 6, the plurality of raised portions each having a height and a diameter, a ratio produced by dividing the height of each of said raised portions by the respective diameter of each of said raised portions is in the range from 2 to 3.

9. The light emitting device according to claim 8, the ratio produced by dividing the height of each of said raised portions by the respective diameter of each of said raised portions is about 2.5.

10. The light emitting device according to claim 6, the plurality of raised portions each having a height and a pitch between adjacent raised portions, at which each of said plurality of raised portions are aligned, a ratio produced by dividing the diameter of each of said raised portions by the respective pitch of adjacent raised portions being in the range from 0.65 to 0.85.

11. The light emitting device according to claim 6, the plurality of raised portions each having a pitch between adjacent raised portions, at which each of said plurality of raised portions are aligned, said optical portion being arranged so that the pitch at which said plurality of raised portions are aligned is in the range from 500 nanometers to 2000 nanometers.

12. An image display device, comprising:
   a light source portion including the light emitting device of claim 1 that supplies light; and
   a spatial light modulator that modulates light from said light source portion in response to an image signal.

13. The light emitting device according to claim 1, said optical portion including a plurality of recessed portions having a depth in a direction approximately orthogonal to said reference plane.

14. A method of manufacturing a light emitting device having a light emitting portion for supplying light, the method comprising:
   providing the light emitting portion on a reference plane;
   forming an optical portion having a refractive index, the refractive index periodically changing in a two-dimensional direction; and
   layering said optical portion, on said light emitting portion provided on the reference plane, approximately parallel to said two-dimensional direction.

* * * * *